United States Patent
Kim et al.

(10) Patent No.: US 7,785,965 B2
(45) Date of Patent: Aug. 31, 2010

(54) DUAL STORAGE NODE MEMORY DEVICES AND METHODS FOR FABRICATING THE SAME

(75) Inventors: Unsoon Kim, San Jose, CA (US);
Kyunghoon Min, Palo Alto, CA (US);
Ning Cheng, San Jose, CA (US);
Hiroyuki Kinoshita, San Jose, CA (US);
Sugino Rinji, San Jose, CA (US);
Timothy Thurgate, Sunnyvale, CA (US); Angela Hui, Fremont, CA (US);
Jihwan Choi, San Mateo, CA (US); Chi Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/530,145

(22) Filed: Sep. 8, 2006

(65) Prior Publication Data
US 2008/0064165 A1 Mar. 13, 2008

(51) Int. Cl.
*H01L 21/336* (2006.01)
(52) U.S. Cl. .............................. 438/264; 257/E21.679
(58) Field of Classification Search ................ 438/264, 438/589, 594, 270, 259; 257/E21.423, E21.679, 257/E21.585, E21.655, E21.657
See application file for complete search history.

(56) References Cited

U.S. PATENT DOCUMENTS

| 5,904,526 | A * | 5/1999 | Wen et al. ..................... 438/275 |
|---|---|---|---|
| 7,220,634 | B2 * | 5/2007 | Prall et al. ..................... 438/216 |
| 7,288,809 | B1 * | 10/2007 | Fastow et al. ................. 257/314 |
| 7,292,478 | B2 * | 11/2007 | Yu et al. ..................... 365/185.28 |
| 2002/0045304 | A1 * | 4/2002 | Lee ............................. 438/201 |
| 2003/0134478 | A1 * | 7/2003 | Lai et al. ..................... 438/275 |
| 2005/0110102 | A1 * | 5/2005 | Wang et al. ................. 257/411 |
| 2005/0148173 | A1 * | 7/2005 | Shone ......................... 438/672 |
| 2007/0045717 | A1 * | 3/2007 | Parascandola et al. ...... 257/324 |
| 2007/0045722 | A1 * | 3/2007 | Lee ............................. 257/330 |

OTHER PUBLICATIONS

Willer et al., UMEM: A U-shape Non-Volatile-Memory Cell, Ingentix GmbH & Co., 2000.

* cited by examiner

*Primary Examiner*—W. David Coleman
*Assistant Examiner*—Latanya Crawford

(57) ABSTRACT

Dual storage node memory devices and methods for fabricating dual storage node memory devices have been provided. In accordance with an exemplary embodiment, a method includes the steps of etching a plurality of trenches in a semiconductor substrate and forming a layered structure within the trenches. The layered structure includes a tunnel dielectric layer and a charge storage layer. Bit lines are formed within the semiconductor substrate and a layer of conductive material is deposited overlying the layered structure.

9 Claims, 5 Drawing Sheets

DUAL STORAGE NODE MEMORY DEVICES AND METHODS FOR FABRICATING THE SAME

FIELD OF THE INVENTION

The present invention generally relates to semiconductor memory devices and to methods for their fabrication, and more particularly relates to dual storage node memory devices and methods for fabricating dual storage node memory devices.

BACKGROUND OF THE INVENTION

One form of semiconductor memory is a nonvolatile memory in which the memory state of a memory cell is determined by whether or not an electrical charge is stored on a charge storage layer built into the gate structure of a field effect transistor. To enhance the storage capacity of such a nonvolatile memory, two storage nodes can be built into each memory cell. The storage nodes are associated with locations in charge storage layers at opposite sides of the gate structure. As the capacity of semiconductor memories increases, the size of each individual device used to implement the memory shrinks in size. With a memory that uses dual storage nodes per memory cell, the reduction in device size means that the spacing between the two storage nodes of a memory cell decreases. As the spacing between storage nodes decreases, problems arise with respect to the reliability and retention of the memory data.

Accordingly, it is desirable to provide methods for fabricating semiconductor memory devices that permit scaling of a dual storage node memory cell without adversely affecting device reliability or memory retention. In addition, it is desirable to provide reliable dual storage node memory devices that can be readily scaled to reduced device dimensions. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

In accordance with an exemplary embodiment of the present invention, a method for fabricating a dual storage node memory device is provided. The method comprises the steps of etching a plurality of trenches in a semiconductor substrate and forming a layered structure within the trenches. The layered structure comprises a tunnel dielectric layer and a charge storage layer. Bit lines are formed within the semiconductor substrate and a layer of conductive material is deposited overlying the layered structure.

In accordance with another exemplary embodiment of the present invention, a method for fabricating a dual storage node memory device is provided. The method comprises the step of implanting impurity dopants into a semiconductor substrate. A hard mask layer is formed and patterned overlying the semiconductor substrate. A plurality of trenches is etched within the semiconductor substrate and the patterned hard mask is removed. A tunnel dielectric layer is formed overlying the semiconductor substrate and within the trenches, and a charge storage layer is formed overlying the tunnel dielectric layer. A charge barrier dielectric layer is formed overlying the charge storage layer and a control gate electrode layer is formed overlying the charge barrier dielectric layer.

In accordance with a further exemplary embodiment of the present invention, a method for fabricating a semiconductor memory device is provided. The method comprises the steps of etching a plurality of trenches in a semiconductor substrate and forming a layered structure on the semiconductor substrate. The layered structure comprises a tunnel dielectric layer and a charge storage layer. Impurity dopants are implanted into the semiconductor substrate and a layer of conductive material is deposited overlying the layered structure.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
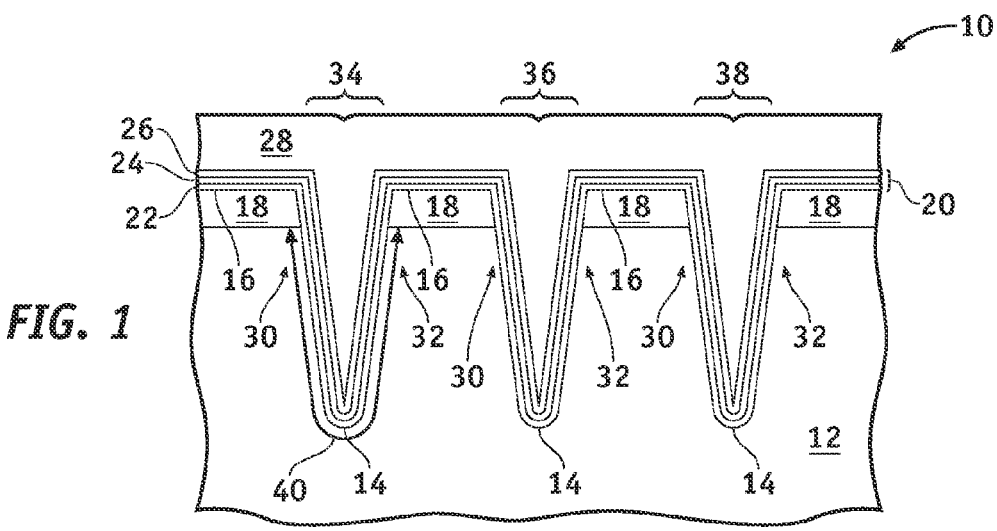
FIG. 1 is a cross-sectional view of a dual storage node memory device, in accordance with an exemplary embodiment of the present invention.

Referring to FIG. 1, in accordance with an exemplary embodiment of the present invention, a portion of a trench-defined dual storage node flash memory device 10 is illustrated. Memory device 10 includes a semiconductor substrate 12 within which are formed spaced-apart trenches 14. Between the trenches 14 are peaks 16 of the semiconductor substrate. Impurity-doped regions 18, otherwise known as bit lines, are disposed at the peaks 16 in the semiconductor substrate 12 between the trenches. A layered structure 20 is disposed on the substrate within the trenches 14 and on the peaks 16. The layered structure 20 typically comprises, for example, a charge trapping layer, often a silicon nitride layer 24, disposed between a first or bottom silicon dioxide layer (commonly referred to as a tunnel oxide layer) 22 and a second or top silicon dioxide layer 26 (commonly referred to as a charge barrier layer). A control gate electrode layer 28 is disposed over the layered structure 20 to form a first storage node or bit 30 and a second storage node or bit 32 of memory cells 34, 36, and 38. The storage nodes 30 and 32 of each cell are relatively close together in a horizontal direction but are isolated from each other by the control gate electrode layer 28. This configuration permits more memory cells to be fabricated in a relatively smaller area of the substrate than if the layered structure was formed on a flat substrate surface. However, because the storage nodes are separated by relatively long channel 40 (the region of the semiconductor substrate 12 that underlies the layered structure 20), minimal leakage occurs between the storage nodes and memory device integrity is maintained. Although portions of only three dual bit memory cells are illustrated, those of skill in the art will appreciate that memory device 10 may include a large number of such cells.

FIGS. 2-8 illustrate method steps for fabricating a dual storage node memory device, such as memory device 10, in accordance with various embodiments of the invention. Many of the steps employed in the fabrication of semiconductor devices are well known and so, in the interest of brevity, some of those conventional steps will only be mentioned briefly herein or will be omitted entirely without providing the well known process details.

Figure 2:
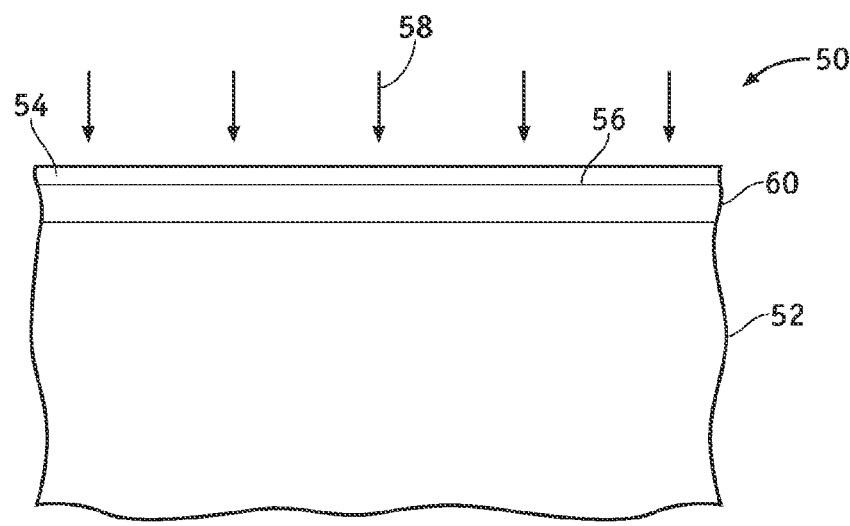
FIGS. 2-8 illustrate, in cross section, a method for fabricating a dual storage node memory device, in accordance with an exemplary embodiment of the present invention.

As illustrated in FIG. 2, the manufacture of a memory device 50 begins by providing a semiconductor substrate 52. Semiconductor substrate 52 will hereinafter be referred to, for convenience of discussion but without limitation, as a silicon substrate, although those of skill in the art will understand that other semiconductor materials such as germanium, gallium arsenide, or the like can also be used. As used herein, the term "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. The silicon substrate can be a bulk silicon wafer as illustrated or can be a thin layer of silicon on an insulator (SOI) that, in turn is supported by a semiconductor carrier substrate.

A dielectric layer 54 is formed on a surface 56 of silicon substrate 52. Dielectric layer 54 is preferably a thermally grown layer of silicon dioxide having a thickness of about 5-15 nanometers (nm), more preferably about 10 nm, although the layer can be formed of other dielectric materials that are grown or deposited at surface 56 of the semiconductor substrate. As is well known, dielectric materials can be deposited, for example, by chemical vapor deposition (CVD), low pressure chemical vapor deposition (LPCVD) or plasma enhanced chemical vapor deposition (PECVD). Impurity dopants, illustrated by arrows 58, are implanted into the silicon substrate 52 and dielectric layer 54 by ion implantation to form an impurity-doped layer 60. The impurity-doped layer 60 preferably is formed by implanting an N-type impurity dopant, more preferably arsenic ions or phosphorous ions, using an ion implantation energy in the range of about 5 keV to about 10 keV.

Figure 3:
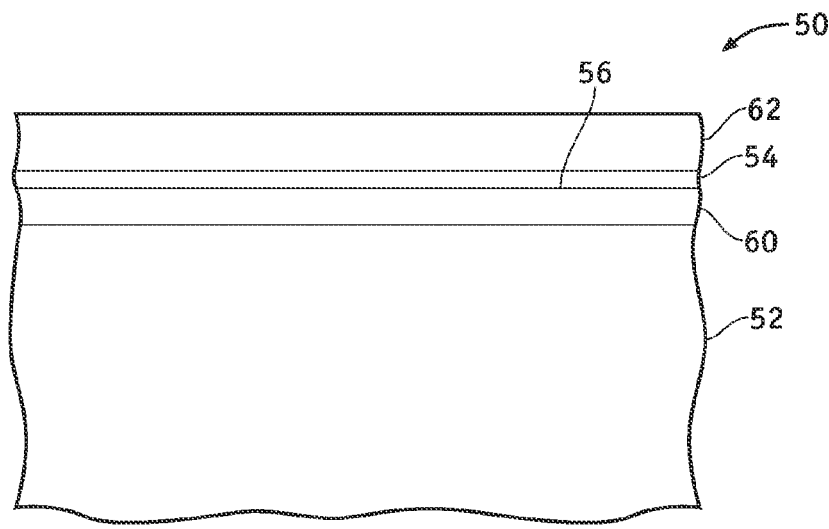
Figure 4:
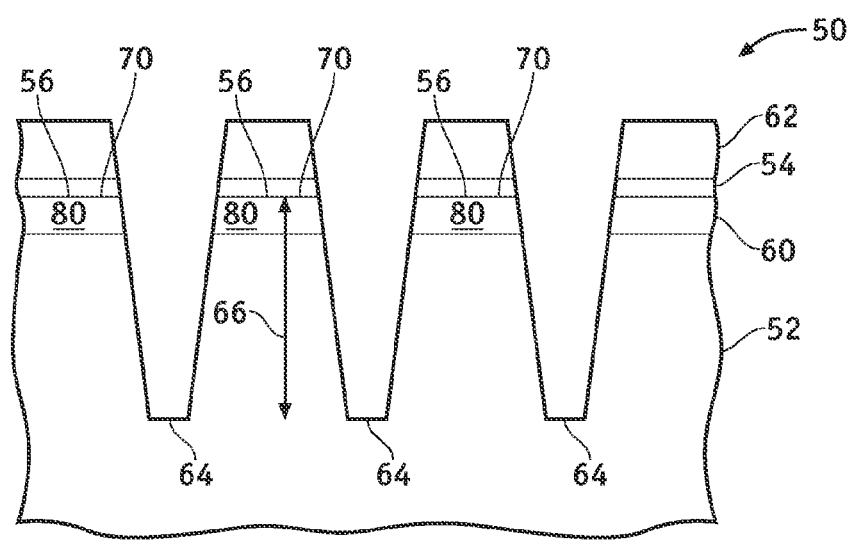

Referring to FIG. 3, a layer 62 of hard mask material is deposited onto dielectric layer 54 to aid in subsequently patterning the substrate. The hard mask material is comprised of a material, such as, for example, silicon oxide, silicon nitride, silicon oxynitride, and/or amorphous carbon, that has an etch rate that is faster than the etch rate of dielectric layer 54 when exposed to the same etch chemistry. The hard mask layer 62 is preferably silicon nitride deposited to a thickness in the range of about 100 to about 150 nm. Referring to FIG. 4, the hard mask layer 62 is patterned, for example, by using a patterned photoresist layer (not illustrated) and etching to etch stop dielectric layer 54. The patterned hard mask layer is subsequently used as an etch mask to etch the dielectric layer 54, the impurity-doped layer 60, and the silicon substrate 52. The hard mask can be etched, for example by plasma etching using a $CHF_3$, $CF_4$, or $SF_6$ chemistry, and the silicon substrate can be etched by, for example, plasma etching in a Cl or $HBr/O_2$ chemistry, to form spaced-apart trenches 64 within silicon substrate 52 and peaks 70 between the trenches. In an exemplary embodiment of the invention, the trenches have a depth, illustrated by a double-headed arrow 66, as measured from the surface 56 of silicon substrate 52, in the range of about 0.11 to about 0.15 μm. Formation of the trenches 64 also results in the formation of bit lines 80, which comprise the remaining impurity-doped layer 60 at peaks 70 of the silicon substrate between the trenches.

Figure 5:
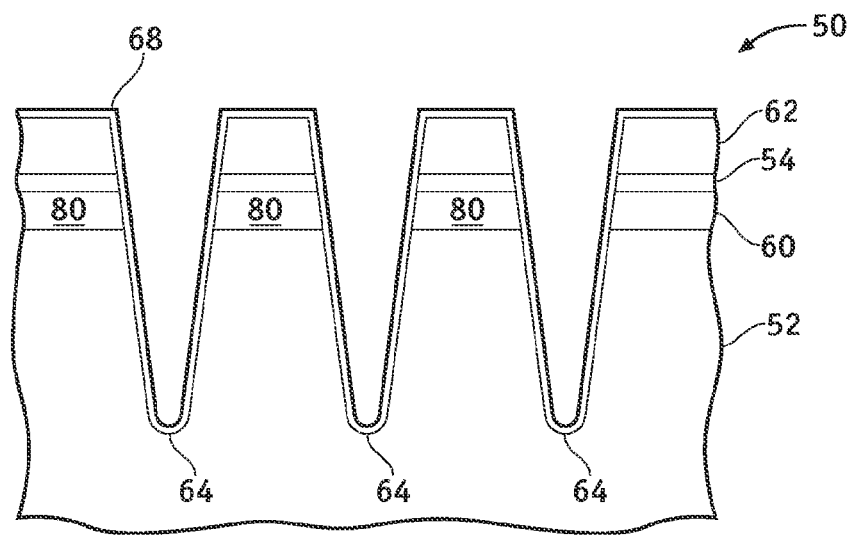

In an exemplary embodiment of the present invention, after formation of trenches 64, the silicon substrate 52 is subjected to a thermal anneal to smooth and round-out trenches 64, as illustrated in FIG. 5. In a preferred embodiment of the invention, the silicon substrate is annealed in a hydrogen ($H_2$) ambient of about 80 Torr at a temperature of about 900 to about 1000° C. for approximately 1 to 2 minutes. A thin dielectric liner 68 then is grown overlying the silicon substrate 52 to protect the silicon substrate during subsequent removal of the hard mask layer 62. The dielectric liner 68 can be formed by conventional thermal processes, preferably at relatively low temperatures in the range of about 800 to about 900° C. to minimize diffusion of the impurity dopants into the silicon substrate. In an exemplary embodiment of the invention, the dielectric liner 68 is a thermally grown oxide liner having a thickness in the range of about 5 to about 10 nm. The hard mask layer 62 is removed and the dielectric liner 68 is stripped from the silicon substrate using, for example, vapor phase hydrofluoric (HF) etching or by etching in a solution of dilute hydrofluoric acid.

Figure 6:
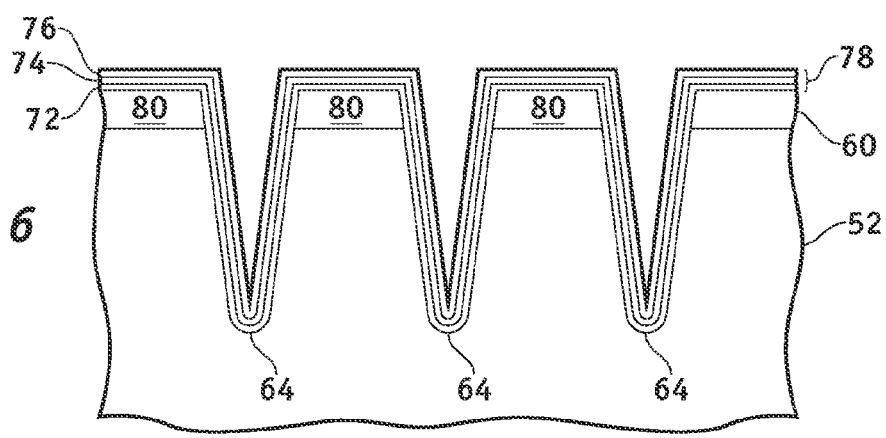

Referring to FIG. 6, in accordance with one embodiment of the invention, a layer of oxide 72 is formed over silicon substrate and within trenches 64. The oxide layer 72 preferably is formed by rapid thermal oxidation (RTO) at a temperature in the range of about 950-1050° C. for less than about one minute. The use of rapid thermal oxidation to form oxide layer 72 minimizes the thermal budget of the process, thus minimizing the diffusion of the implanted impurity dopants in dopant layer 60. A layer of charge storage material 74 is deposited over the layer of oxide. The charge storage material layer may be formed using any appropriate process steps and materials, including deposition techniques as are known, such as thermal deposition, chemical vapor deposition (CVD), low pressure chemical vapor deposition (LPCVD), plasma enhanced chemical vapor deposition (PECVD), or atomic layer deposition (ALD). A further charge barrier layer of oxide 76 is deposited over the layer of charge storage material with the three layers forming an O—R—O layered storage node structure 78, where "R" indicates a generic charge storage material. Charge barrier layer 76 also preferably is formed by RTO as described above, again to minimize the thermal budget of the process and the diffusion of the implanted impurity dopants in dopant layer 60.

Layer of oxide 72 preferably is a tunneling layer having a thickness of about 3-12 nm, more preferably about 5-9 nm, that allows tunneling of charge carriers between the semiconductor substrate 52 and the charge storage layer 74. Charge storage layer 74 can be a deposited layer of silicon nitride, silicon rich silicon nitride, polycrystalline silicon, or other charge storage material. Silicon rich silicon nitride is a silicon nitride having a silicon content greater than the silicon content of stoichiometric silicon nitride. Silicon rich nitride is more conductive than stoichiometric silicon nitride and tends to have shallower trap energy levels and higher trap density, both of which allow electrons to move easily to enable Fowler-Nordheim erase of the memory storage nodes. The charge storage layer can be deposited, for example by LPCVD to a thickness of preferably about 3-12 nm, more preferably about 5-9 nm. If the charge storage layer is silicon nitride or silicon rich silicon nitride, the layer can be deposited, for example, by the reaction of dichlorosilane ($SiH_2Cl_2$) and ammonia. If the charge storage layer is polycrystalline silicon, the layer can be deposited by, for example, the reduction of silane. Charge barrier layer 76 (the second "O" of O—R—O) can be a silicon oxide or a high dielectric constant (high-K) insulator such as HfSiO, or the like, or a combination of a high-K dielectric and a layer of oxide. Preferably the layer is deposited by LPCVD to a thickness of about 3-12 nm, more preferably about 5-9 nm.

Figure 7:
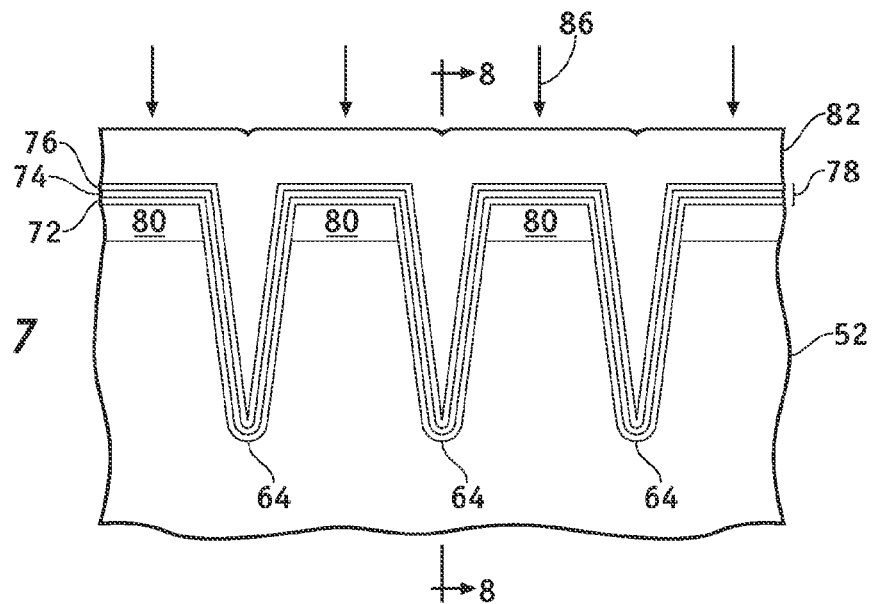

Referring to FIG. 7, a control gate material layer 82, preferably of polycrystalline silicon or, in the alternative, metal or other conductive material, is deposited overlying the layered structure 78. The polycrystalline silicon can be deposited, for example, by LPCVD by the hydrogen reduction of silane ($SiH_4$). The layer of polycrystalline silicon can be deposited as an impurity doped layer, but is preferably deposited as undoped polycrystalline silicon and is subsequently impurity doped by ion implantation. In a preferred embodiment of the invention, the polycrystalline silicon layer 82 is deposited to a thickness of about 150 to 200 nm, more preferably about 185 nm, and is implanted with N-type impurity dopants, illustrated by arrows 86, such as arsenic, at an implant energy of about 30 keV-50 keV, more preferably 40 keV, to ensure doping of the polycrystalline silicon deep within the trenches.

Figure 8:
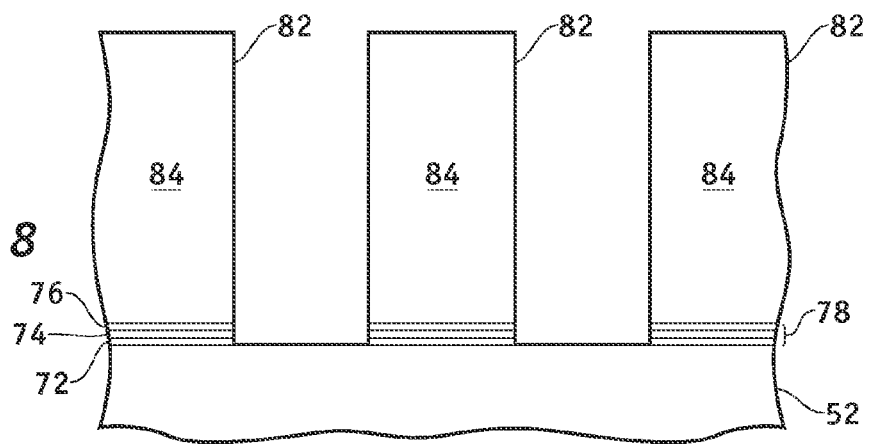

In an exemplary embodiment of the invention, a hard mask or antireflective coating (ARC) layer (not shown) can be deposited on the control gate material layer 82 and patterned using conventional photolithography techniques. As illustrated in FIG. 8, the polycrystalline silicon layer 82 and the layered structure 78 are etched by, for example, plasma etching in a Cl or $HBr/O_2$ chemistry, to form word lines 84, that are disposed perpendicular to bit lines 60.

FIGS. 9-15 illustrate a method for fabricating a dual storage node memory device 100 in accordance with another exemplary embodiment of the invention. Memory device 100 is similar to memory device 50 of FIGS. 2-8 and, accordingly, elements of FIGS. 9-15 that have the same reference numbers as elements of FIGS. 2-8 are the same elements of FIGS. 2-8 and may be formed of any of the same materials and by any of the same methods as described above with reference to FIGS. 2-8.

Figure 9:
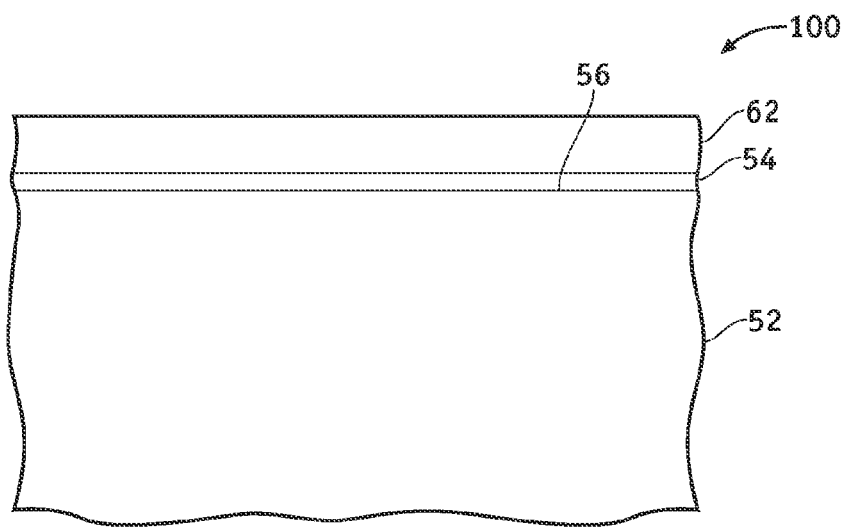
FIGS. 9-15 illustrate, in cross section, a method for fabricating a dual storage node memory device, in accordance with another exemplary embodiment of the present invention.

In accordance with an exemplary embodiment of the present invention, as illustrated in FIG. 9, the method includes the step of thermally growing dielectric layer 54 on surface 56 of silicon substrate 52, although the layer can be formed of other dielectric materials that are grown or deposited at surface 56 of the semiconductor substrate 52. As described above, in accordance with an exemplary embodiment of the present invention, the oxide layer is grown to a thickness in the range of about 5 to about 15 nm. In a preferred embodiment of the invention, the oxide layer has a thickness of about 10 nm. Layer 62 of hard mask material, such as, for example, silicon oxide, silicon nitride, silicon oxynitride, and/or amorphous carbon, is deposited onto the surface 56 of the silicon substrate 52 to aid in subsequently patterning the substrate. The hard mask layer 62 is preferably silicon nitride deposited to a thickness in the range of about 100 to about 150 nm.

Figure 10:
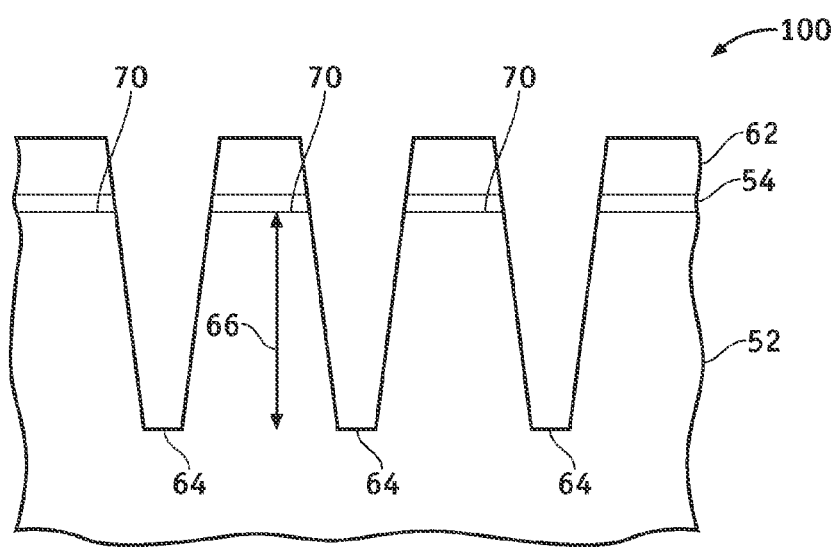

Referring to FIG. 10, the hard mask layer 62 is patterned and the dielectric layer 54 and the silicon substrate 52 are etched by, for example, plasma etching in a Cl or $HBr/O_2$ chemistry, to form spaced-apart trenches 64 within silicon substrate 52 and peaks 70 of silicon substrate between the trenches. In an exemplary embodiment of the invention, the trenches have a depth, illustrated by double-headed arrow 66, as measured from the surface 56 of silicon substrate 52, in the range of about 0.11 to about 0.15 µm.

Figure 11:
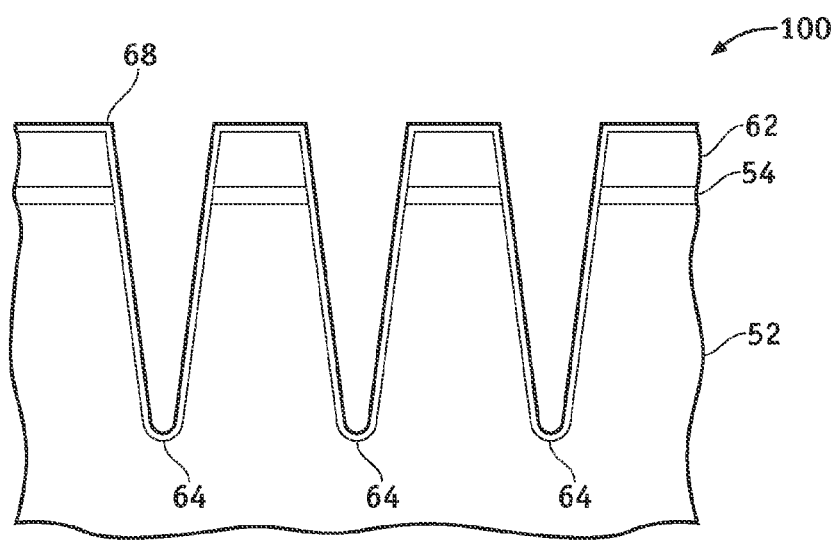

In an exemplary embodiment of the present invention, after formation of trenches 64, the silicon substrate 52 is subjected to a thermal anneal to smooth and round-out trenches 64, as illustrated in FIG. 11. In preferred embodiment of the invention, the silicon substrate is annealed in a hydrogen ($H_2$) ambient of about 80 Torr at a temperature of about 900 to about 1000° C. for approximately 1 to 2 minutes. Thin oxide liner 68 then is grown overlying the silicon substrate to protect the silicon substrate 52 during subsequent removal of the hard mask layer. Preferably, the oxide liner 68 has a thickness in the range of about 5 to about 10 nm. The hard mask layer 62 then is removed by suitable conventional methods and the oxide liner 68 is stripped from the silicon substrate.

Figure 12:
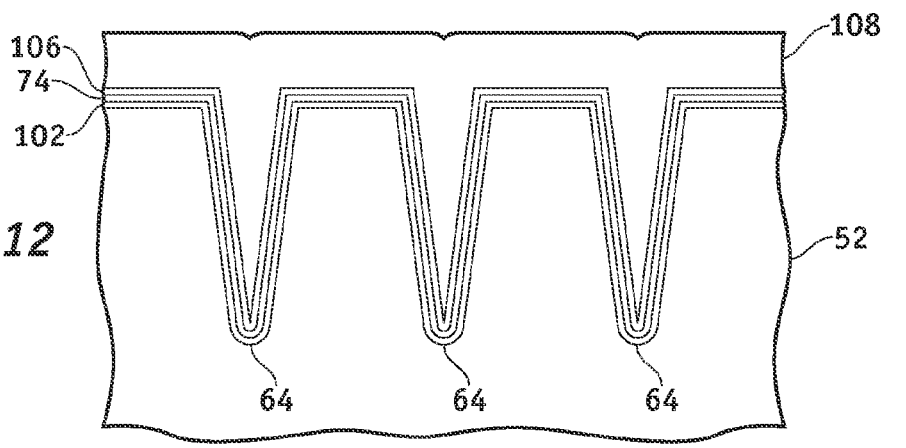

Referring to FIG. 12, in accordance with one embodiment of the invention, a first silicon oxide layer 102 and charge storage material layer 74 are formed overlying substrate 52. As no impurity dopant implantation has yet been performed, the oxide layer 102 may be formed using any appropriate process steps and materials, including oxidation and/or deposition techniques as are known, such as thermal deposition, chemical vapor deposition (CVD), low pressure chemical vapor deposition (LPCVD), plasma enhanced chemical vapor deposition (PECVD), or atomic layer deposition (ALD). Charge storage layer 74 is formed in the same manner as described above. A sacrificial dielectric layer 106 is formed overlying charge storage material layer 74. Layer 106 can be, for example, a layer of silicon oxide deposited by a high temperature (HTO) deposition process, or by an LPCVD or PECVD process. A sacrificial control gate material layer 108, preferably of polycrystalline silicon, is deposited overlying the sacrificial layer 106. In a preferred embodiment of the invention, the polycrystalline silicon layer 108 is deposited to a thickness of about 50 to 150 nm, more preferably 100 nm.

Figure 13:
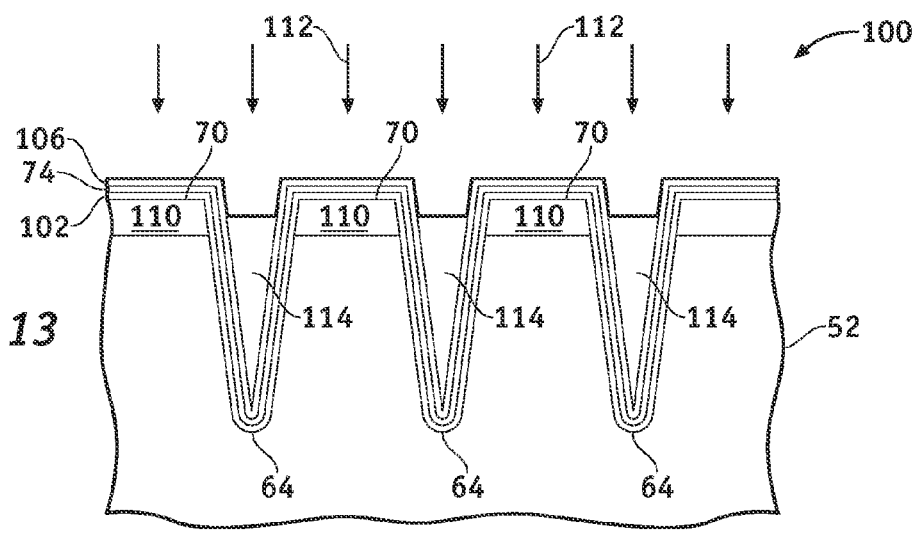

As illustrated in FIG. 13, the polycrystalline silicon layer 108 is etched to remove the layer overlying the peaks 70 of substrate 52 and to remove a portion of the layer from within the trenches 64, thus forming polycrystalline silicon plugs 114 within the trenches. In a preferred embodiment of the invention, an overetch of the layer 108 of about 20% is performed to remove a portion of layer 108 from within the trenches. Accordingly, if approximately 100 nm of polycrystalline silicon is deposited on sacrificial dielectric layer 106 overlying peaks 70, approximately 20 nm of polycrystalline silicon may be removed from within trenches 70.

Impurity dopants, illustrated by arrows 112, are implanted into the polycrystalline silicon plugs 114, the portions of the oxide layers 102 and 106 and the charge storage layer 74 that are not protected by the polycrystalline silicon plugs 114, and the peaks of silicon substrate 52 to form bit lines 110. The bit lines 110 preferably are formed by implanting an N-type impurity dopant, preferably arsenic ions or phosphorous ions, using an ion implantation energy in the range of about 30 keV to about 50 keV.

Figure 14:
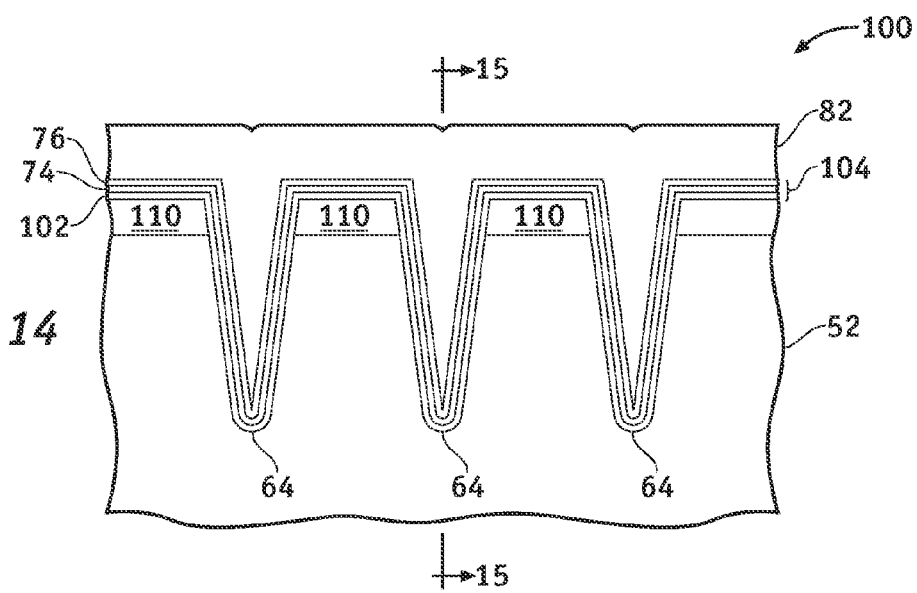

Referring to FIG. 14, the method in accordance with an exemplary embodiment of the present invention, continues with the removal of the polycrystalline silicon plugs 114. The polycrystalline silicon plugs 114 can be removed, for example, by plasma etching in a Cl or $HBr/O_2$ chemistry. Because of damage that may have been suffered from the plasma etch, sacrificial oxide layer 106 also is removed, such as by etching in a solution of dilute hydrofluoric acid. Charge barrier layer of oxide 76 then is deposited over the layer of charge storage material 74 forming a multi-layer O—R—O layered storage node structure 104, where "R" indicates a generic charge storage material. Charge barrier layer 76 is formed by RTO as described above, to minimize the thermal budget of the process and to minimize the diffusion of the implanted impurity dopants of bit lines 110.

Control gate material layer 82, preferably of polycrystalline silicon or, in the alternative, metal or other conductive material, is deposited overlying the layered structure 104. The polycrystalline silicon can be deposited, for example, by LPCVD by the hydrogen reduction of silane ($SiH_4$). The layer of polycrystalline silicon can be deposited as an impurity doped layer, but is preferably deposited as undoped polycrystalline silicon and is subsequently impurity doped by ion implantation. In a preferred embodiment of the invention, the polycrystalline silicon layer 82 is deposited to a thickness of about 150 to 200 nm, more preferably 185 nm, and is implanted with N-type impurity dopants, such as arsenic, at an implant energy of about 30 keV-50 keV, more preferably 40 keV, to ensure doping of the polycrystalline silicon deep within the trenches.

Figure 15:
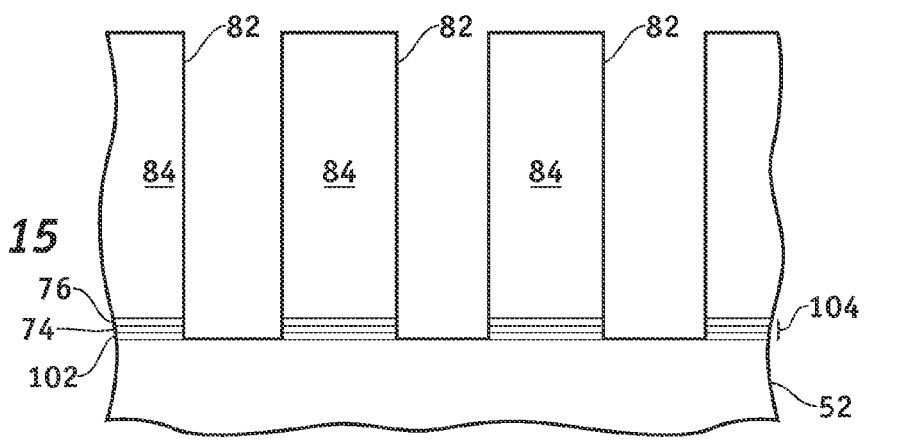

In an exemplary embodiment of the invention, a hard mask or antireflective coating (ARC) layer (not shown) can be deposited on the control gate material layer 82 and patterned using conventional photolithography techniques. As illustrated in FIG. 15, the polycrystalline silicon layer 82 and the layered structure 104 are etched, for example, by plasma etching in a Cl or HBr/O$_2$ chemistry, to form word lines 84, that are disposed perpendicular to bit lines 110.

Accordingly, dual storage node memory devices and methods for fabricating dual storage node memory devices have been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a dual storage node memory device, the method comprising the steps of:
   etching a plurality of trenches in a semiconductor substrate; forming a layered structure comprising a tunnel dielectric layer and a charge storage layer within the trenches;
   forming a sacrificial dielectric layer overlying the layered structure;
   depositing a sacrificial control gate material layer overlying the layered structure and the sacrificial dielectric layer;
   etching the sacrificial control gate material layer to form plugs of the sacrificial control gate material layer within each of the plurality of trenches
   forming bit lines within the semiconductor substrate;
   removing the plugs of the sacrificial control gate material layer;
   removing the sacrificial dielectric layer;
   forming a charge barrier layer overlying the charge storage layer; and
   depositing a layer of conductive material overlying the layered structure.

2. The method of claim 1, further comprising the step of implanting impurity dopants into the layer of conductive material by ion implantation at an implant energy of about 30 keV to about 50 keV.

3. The method of claim 1, wherein the step of etching a plurality of trenches comprises the steps of:
   forming a hard mask material layer overlying the semiconductor substrate;
   patterning the hard mask material layer; and
   etching the semiconductor substrate to form the plurality of trenches therein.

4. The method of claim 1, wherein the step of forming bit lines comprises the step of implanting impurity dopants into the semiconductor substrate using ion implantation.

5. The method of claim 1 wherein the step of forming a layered structure comprises the step of:
   forming the tunnel dielectric layer by rapid thermal oxidation (RTO) for less than about one minute.

6. The method of claim 1, wherein the step of forming a charge barrier layer overlying the charge storage layer comprises forming the charge barrier layer by RTO performed for less than about one minute.

7. The method of claim 3, further comprising the steps of:
   forming a dielectric liner on the semiconductor substrate;
   removing the hard mask material layer; and
   removing the dielectric liner.

8. A method for fabricating a semiconductor memory device, the method comprising the steps of:
   etching a plurality of trenches in a semiconductor substrate;
   forming a layered structure on the semiconductor substrate, wherein the layered structure comprises a tunnel dielectric layer and a charge storage layer;
   forming a sacrificial dielectric layer overlying the layered structure;
   depositing a sacrificial control gate material layer overlying the sacrificial dielectric layer;
   removing a portion of the sacrificial control gate material layer from within the trenches;
   implanting impurity dopants into the semiconductor substrate after removing the portion of the sacrificial control gate material layer;
   removing the sacrificial control gate material layer;
   removing the sacrificial dielectric layer;
   forming a charge barrier layer overlying the charge storage layer, wherein the charge barrier layer is formed by RTO for less than about one minute; and
   depositing a layer of conductive material overlying the charge barrier layer.

9. The method of claim 8 wherein the step of forming a layered structure comprises the step of:
   forming the tunnel dielectric layer by rapid thermal oxidation (RTO) for less than about one minute.

* * * * *